US 8,781,828 B2

(12) United States Patent
Park et al.

(10) Patent No.: US 8,781,828 B2
(45) Date of Patent: Jul. 15, 2014

(54) ELECTRONIC DEVICE AND METHOD OF CONTROLLING THE SAME

(75) Inventors: Hyorim Park, Seoul (KR); Jihyun Kim, Seoul (KR); Jihwan Kim, Seoul (KR); Seijun Lim, Seoul (KR)

(73) Assignee: LG Electronics Inc., Seoul (KR)

( * ) Notice: Subject to any disclaimer, the term of this patent is extended or adjusted under 35 U.S.C. 154(b) by 21 days.

(21) Appl. No.: 13/456,501

(22) Filed: Apr. 26, 2012

(65) Prior Publication Data

US 2013/0289983 A1 Oct. 31, 2013

(51) Int. Cl.
*G10L 15/26* (2006.01)

(52) U.S. Cl.
USPC ............ 704/235; 726/3; 725/78; 725/40; 717/178; 715/719; 709/223; 705/26.1; 455/567; 455/556.1; 370/392; 348/152; 345/163; 341/176

(58) Field of Classification Search
CPC . G06F 3/04886; G06F 1/1626; G06F 3/1643; H04N 21/4126; H04N 21/41407; H04N 21/42204; G08C 2201/93; G08C 2201/30
USPC .......... 340/4.62; 341/176; 345/163; 348/152; 370/392; 455/556.1, 567; 705/26.1; 717/178; 725/40, 78; 726/3; 715/719; 709/223; 250/363.04; 235/380
See application file for complete search history.

(56) References Cited

U.S. PATENT DOCUMENTS

| | | | | |
|---|---|---|---|---|
| 8,072,492 | B2* | 12/2011 | Kondo et al. | 348/152 |
| 8,292,166 | B2* | 10/2012 | Gomez et al. | 235/380 |
| 8,508,478 | B2* | 8/2013 | West et al. | 345/163 |
| 8,548,453 | B2* | 10/2013 | Jeon et al. | 455/419 |
| 2005/0267813 | A1* | 12/2005 | Monday | 705/26 |
| 2007/0265031 | A1* | 11/2007 | Koizumi et al. | 455/556.1 |
| 2008/0034081 | A1* | 2/2008 | Marshall et al. | 709/223 |
| 2008/0048124 | A1* | 2/2008 | Pang et al. | 250/363.04 |
| 2008/0180228 | A1* | 7/2008 | Wakefield et al. | 340/310.11 |
| 2009/0077467 | A1* | 3/2009 | Adappa et al. | 715/719 |
| 2009/0137272 | A1* | 5/2009 | Okuda et al. | 455/556.1 |
| 2009/0172780 | A1* | 7/2009 | Sukeda et al. | 726/3 |
| 2009/0320070 | A1* | 12/2009 | Inoguchi | 725/40 |
| 2010/0066677 | A1* | 3/2010 | Garrett et al. | 345/163 |
| 2010/0124947 | A1* | 5/2010 | Sano | 455/567 |
| 2012/0066675 | A1* | 3/2012 | Shelansky et al. | 717/178 |
| 2012/0099594 | A1* | 4/2012 | Lau et al. | 370/392 |
| 2012/0127012 | A1* | 5/2012 | Gicklhorn et al. | 341/176 |
| 2012/0242526 | A1* | 9/2012 | Perez et al. | 341/176 |
| 2012/0295662 | A1* | 11/2012 | Haubrich | 455/556.1 |
| 2012/0324515 | A1* | 12/2012 | Dashevskiy et al. | 725/78 |

* cited by examiner

*Primary Examiner* — Michael Colucci
(74) *Attorney, Agent, or Firm* — Birch, Stewart, Kolasch & Birch, LLP

(57) ABSTRACT

An electronic device and a method of controlling the electronic device are provided. According to an embodiment, the electronic device may recognize a first sound signal output from at least one external device connectable through a communication unit and to control a sound output of at least one of the at least one external device or the sound output unit when a second sound signal is output through the sound output unit.

23 Claims, 17 Drawing Sheets

ELECTRONIC DEVICE AND METHOD OF CONTROLLING THE SAME

FIELD OF THE INVENTION

Embodiments of the present invention are directed to electronic devices and method of controlling the electronic devices.

RELATED ART

Development of digital devices and network technologies has increased attention to concepts, such as "ubiquitous", "convergence", or "N-Screen".

N-Screen is an advanced version of 3-Screen which has been first suggested in CTIA Wireless 2007 by Randall Stephenson from AT&T. In a 3-Screen system, a television (TV), a personal computer (PC), and a mobile device are connected to one another over the Internet, thereby providing users with seamless networking services irrespective of time, place, or devices.

As a further advanced technology, N-Screen strategy combines networks, contents, as well as devices, and simultaneously controls N main screens.

Rather than being simply understood as a collective concept of devices, networks, and contents as publishes contents at the same time to broadcast terminals, such as IPTVs, mobile terminals, or personal computers, N-Screen needs to be considered together with network flat forms of enabling connections with various devices, how each device uses contents, or accompanying business models.

Currently, only a few types of contents are, however, published to all the devices included in an N-Screen system. In the conventional N-Screen services, television contents are simultaneously distributed both to wired networks and wireless networks or the same contents are shared by such networks, and the contents are mostly focused on movie contents.

Accordingly, there is a need for technologies that can diversify contents to be provided to devices and can more efficiently control execution of contents between a main device and auxiliary devices included in an N-Screen system.

SUMMARY

Embodiments of the present invention provide an electronic device that can more efficiently control diverse types of contents, which are shared between devices in an N-Screen system, through one device and a method of controlling the electronic device.

According to an embodiment of the present invention, there is provided an electronic device including a communication unit, a sound output unit, and a controller configured to recognize a first sound signal output from at least one external device connectable through the communication unit and to control a sound output of at least one of the at least one external device and the sound output unit when a second sound signal is output through the sound output unit.

The controller is configured to be synchronized with the at least one external device through the communication unit to share a content executed by the at least one external device.

The controller is configured to receive a second content associated with a first content executed by the at least one external device through the communication unit, and wherein the second sound signal includes a sound signal associated with the second content.

The second content includes metadata of the first content.

The controller is configured to transmit a control signal to the at least one external device through the communication unit, and wherein the control signal is configured to set a sound output mode of the at least one external device to a mute mode.

The controller is configured to transmit a control signal to the at least one external device, wherein the control signal is configured to enable the second sound signal to be output from the at least one external device.

The controller is configured to set a sound output mode of the sound output unit to a mute mode.

The electronic device further includes a display unit, wherein the second sound signal includes a voice signal, and wherein the controller is configured to convert the voice signal into text and to display the converted text through the display unit.

The electronic device further includes a touch screen, wherein the controller is configured to provide a user interface to the touch screen to complementarily control volumes of the first and second sound signals output through the at least one external device and the sound output unit.

The electronic device further includes a touch screen, wherein the controller is configured to display a user interface on the touch screen to select a device to output a sound among the at least one external device and the sound output unit.

According to an embodiment of the present invention, there is provided an electronic device including a sound output unit, a communication unit configured to establish a network with at least one external device, and a controller configured to receive an auxiliary content of a main content executed by the at least one external device through the communication unit and to perform control so that when a second sound signal is output in response to execution of the auxiliary content through the sound output unit while a first sound signal is output in response to execution of the main content through the at least one external device, one of the first sound signal and the second sound signals is output through one of the at least one external device and the sound output unit.

The auxiliary content includes metadata of the main content.

According to an embodiment of the present invention, there is provided an electronic device including a communication unit, a touch screen, a sound output unit, and a controller configured to recognize a first sound signal output by at least one external device connectable through the communication unit, to display a user interface on the touch screen to complementarily control volumes of the first sound signal and the second sound signal output through the at least one external device and the sound output unit, respectively, when a second sound signal is output through the sound output unit, and to output a first control signal to increase a volume of the first sound signal or the second sound signal corresponding to the at least one external device or the sound output unit in accordance with a particular direction a drag input is applied to the user interface.

The controller is configured to output a second control signal to decrease a volume of the first sound signal or the second sound signal corresponding to the at least one external device or the sound output in accordance with an opposite direction to the particular direction the drag input is applied to the user interface.

According to an embodiment of the present invention, there is provided a method of controlling an electronic device, the method including connecting to at least one external device through a communication unit of the electronic device, recognizing a first output signal output from the at least one external device, and controlling at least one sound output from the at least one external device and a sound output unit of the electronic device when a second sound signal is output through the sound output unit.

The method further includes synchronizing the electronic device with the at least one external device and receiving a content associated with a content executed by the at least one external device.

According to an embodiment of the present invention, there is provided a method of controlling an electronic device, the method including forming a network with at least one external device through a communication unit of the electronic device, receiving an auxiliary content of a main content executed by the at least one external device through the communication unit, recognizing a first sound signal output through the at least one external device according to execution of the main content, outputting a second sound signal through a sound output unit of the electronic device according to execution of the auxiliary content, and performing control so that one of the first sound signal and second sound signal is output through one of the at least one external device and the sound output unit.

Other embodiments are apparent from the detailed description with reference to the accompanying drawings.

BRIEF DESCRIPTION OF THE DRAWINGS

The accompanying drawings, which are included to provide a further understanding of described embodiments of the present invention and are incorporated in and constitute a part of this specification, illustrate embodiments of the present invention and together with the description serve to explain aspects and features of the present invention.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, the embodiments are provided so that this disclosure will be thorough and complete, and will fully convey the concept of the invention to those skilled in the art.

Hereinafter, a mobile terminal relating to the present invention will be described below in more detail with reference to the accompanying drawings. In the following description, suffixes "module" and "unit" are given to components of the mobile terminal in consideration of only facilitation of description and do not have meanings or functions discriminated from each other.

The mobile terminal described in the specification can include a cellular phone, a smart phone, a laptop computer, a digital broadcasting terminal, personal digital assistants (PDA), a portable multimedia player (PMP), a navigation system and so on.

Hereinafter, the embodiments of the present invention will be described with respect to the accompanying drawings.

Figure 1:
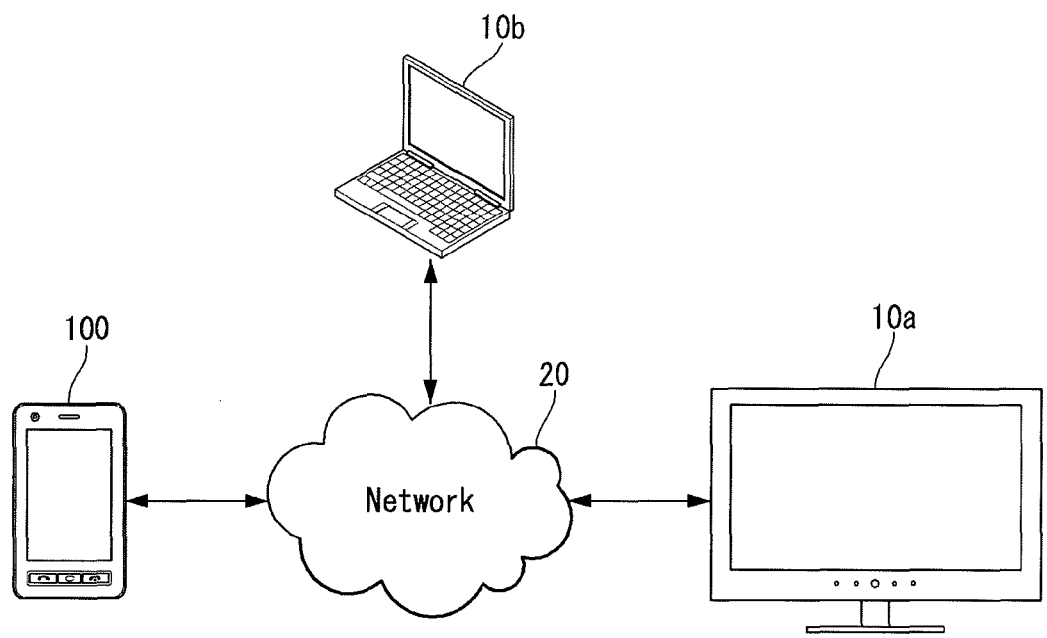
FIG. 1 illustrates a service network according to an embodiment of the present invention. The service network may be an N screen play service network.

FIG. 1 illustrates a service network according to an embodiment of the present invention. The service network may be an N screen play service network. For purposes of illustration, the N-screen service is a 3 screen service.

Referring to FIG. 1, an electronic device 100 is connected to a plurality of external devices 10a and 10b each having an image displaying function. The electronic device 100 may share contents with the external devices 10a and 10b by transferring the contents to the external devices 10a and 10b so that the external devices 10a and 10b may display the contents or by receiving contents from the external devices 10a and 10b and displaying the received contents on its own screen.

The electronic device 100 may utilize various communication standards, such as WiFi, direct WiFi, Zigbee, UWB (Ultra-WideBand), Bluetooth, etc. Depending on communication standard, the electronic device 100 may connect to the external devices 10a and 10b directly or via an access point to perform data communication Although it is illustrated in FIG. 1 that the electronic device 100 is a mobile phone, and the external devices 10a and 10b are a TV 10a and a laptop computer 10b, respectively, the embodiments of the present invention are not limited thereto. According to an embodiment, the electronic device 100, or the external device 10a or 10b may be a smartphone, a laptop computer, a terminal for digital broadcast, a PDA (Personal Digital Assistant), a PMP (Portable Multimedia Player), a navigator, a television, a desktop computer, a set-top box, or the like.

Figure 2:
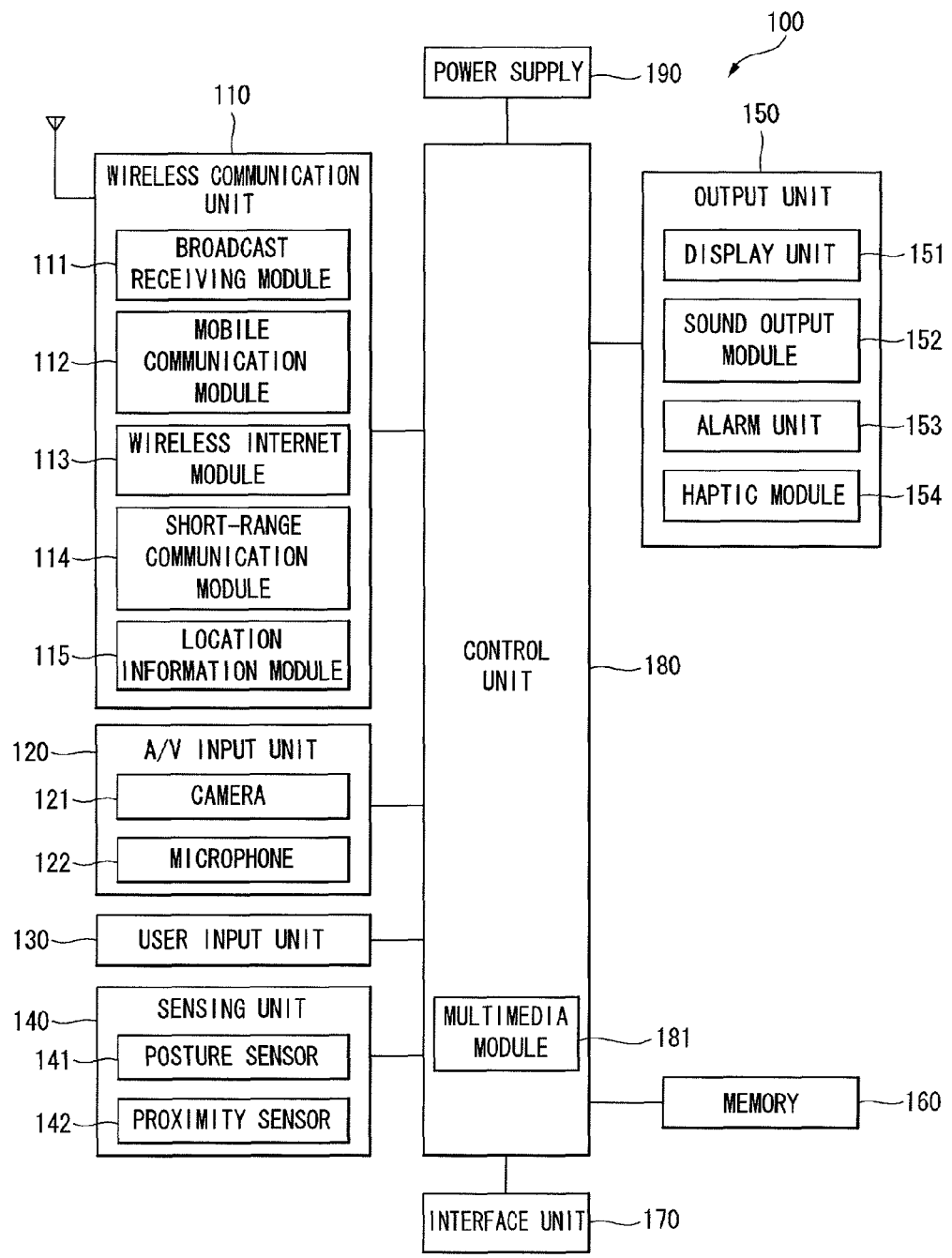
FIG. 2 is a block diagram of a mobile terminal according to an embodiment of the present invention.

FIG. 2 is a block diagram of a mobile terminal 100 according to an embodiment of the present invention. As shown, the mobile terminal 100 includes a wireless communication unit 110, an A/V (Audio/Video) input unit 120, a user input unit 130, a sensing unit 140, an output unit 150, a memory 160, an interface unit 170, a control unit (a controller) 180, and a power supply unit 190, etc. FIG. 2 shows the mobile terminal as having various components, but implementing all of the illustrated components is not a requirement. Greater or fewer components may alternatively be implemented.

In addition, the wireless communication unit 110 generally includes one or more components allowing radio communication between the mobile terminal 100 and a wireless communication system or a network in which the mobile terminal is located. For example, in FIG. 2, the wireless communication unit includes at least one of a broadcast receiving module 111, a mobile communication module 112, a wireless Internet module 113, a short-range communication module 114, and a location information module 115.

The broadcast receiving module 111 receives broadcast signals and/or broadcast associated information from an external broadcast management server via a broadcast channel. Further, the broadcast channel may include a satellite channel and/or a terrestrial channel. The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal combined with a TV or radio broadcast signal.

In addition, the broadcast associated information may refer to information associated with a broadcast channel, a broadcast program or a broadcast service provider. The broadcast associated information may also be provided via a mobile communication network and, in this instance, the broadcast associated information may be received by the mobile communication module 112.

Further, the broadcast signal may exist in various forms. For example, the broadcast signal may exist in the form of an electronic program guide (EPG) of the digital multimedia broadcasting (DMB) system, and electronic service guide (ESG) of the digital video broadcast-handheld (DVB-H) system, and the like.

The broadcast receiving module 111 may also be configured to receive signals broadcast by using various types of broadcast systems. In particular, the broadcast receiving module 111 can receive a digital broadcast using a digital broadcast system such as the multimedia broadcasting-terrestrial (DMB-T) system, the digital multimedia broadcasting-satellite (DMB-S) system, the digital video broadcast-handheld (DVB-H) system, the data broadcasting system known as the media forward link only (MediaFLO®), the integrated services digital broadcast-terrestrial (ISDB-T) system, etc.

The broadcast receiving module 111 can also be configured to be suitable for all broadcast systems that provide a broadcast signal as well as the above-mentioned digital broadcast systems. In addition, the broadcast signals and/or broadcast-associated information received via the broadcast receiving module 111 may be stored in the memory 160.

In addition, the mobile communication module 112 transmits and/or receives radio signals to and/or from at least one of a base station, an external terminal and a server. Such radio signals may include a voice call signal, a video call signal or various types of data according to text and/or multimedia message transmission and/or reception.

The wireless Internet module 113 supports wireless Internet access for the mobile terminal and may be internally or externally coupled to the terminal. The wireless Internet access technique implemented may include a WLAN (Wireless LAN) (Wi-Fi), Wibro (Wireless broadband), Wimax (World Interoperability for Microwave Access), HSDPA (High Speed Downlink Packet Access), or the like.

Further, the short-range communication module 114 is a module for supporting short range communications. Some examples of short-range communication technology include Bluetooth™, Radio Frequency IDentification (RFID), Infrared Data Association (IrDA), Ultra-WideBand (UWB), ZigBee™, and the like.

Also, the location information module 115 is a module for checking or acquiring a location or position of the mobile terminal. The location information module 115 may acquire location information by using a global navigation satellite system (GNSS). Here, the GNSS is a standard generic term for satellite navigation systems revolving around the earth and allowing certain types of radio navigation receivers to transmit reference signals determining their location on or in the vicinity of the surface of the earth. The GNSS may include the United States' global positioning system (GPS), the European Union's Galileo positioning system, the Russian global orbiting navigational satellite system (GLONASS), COMPASS, a compass navigation system, by the People's Republic of China, and the quasi-zenith satellite system (QZSS) by Japan.

An example of GNSS is a GPS (Global Positioning System) module. The GPS module may calculate information related to the distance from one point (entity) to three or more satellites and information related to time at which the distance information was measured, and applies trigonometry to the calculated distance, thereby calculating three-dimensional location information according to latitude, longitude, and altitude with respect to the one point (entity). In addition, a method of acquiring location and time information by using three satellites and correcting an error of the calculated location and time information by using another one satellite may be also used. The GPS module may also continuously calculate the current location in real time and also calculate speed information by using the continuously calculated current location.

With reference to FIG. 2, the A/V input unit 120 is configured to receive an audio or video signal, and includes a camera 121 and a microphone 122. The camera 121 processes image data of still pictures or video obtained by an image capture device in a video capturing mode or an image capturing mode, and the processed image frames can then be displayed on a display unit 151.

Further, the image frames processed by the camera 121 may be stored in the memory 160 or transmitted via the wireless communication unit 110. Two or more cameras 121 may also be provided according to the configuration of the mobile terminal.

In addition, the microphone 122 can receive sounds via a microphone in a phone call mode, a recording mode, a voice recognition mode, and the like, and can process such sounds into audio data. The processed audio data may then be converted for output into a format transmittable to a mobile communication base station via the mobile communication module 112 for the phone call mode. The microphone 122 may also implement various types of noise canceling (or suppression) algorithms to cancel or suppress noise or interference generated when receiving and transmitting audio signals.

Also, the user input unit 130 can generate input data from commands entered by a user to control various operations of the mobile terminal. The user input unit 130 may include a keypad, a dome switch, a touch pad (e.g., a touch sensitive member that detects changes in resistance, pressure, capacitance, etc., due to being contacted), a jog wheel, a jog switch, and the like.

Further, the sensing unit 140 detects a current status of the mobile terminal 100 such as an opened or closed state of the mobile terminal 100, a location of the mobile terminal 100, the presence or absence of user contact with the mobile terminal 100, the orientation of the mobile terminal 100, an acceleration or deceleration movement and direction of the mobile terminal 100, etc., and generates commands or signals for controlling the operation of the mobile terminal 100. For example, when the mobile terminal 100 is implemented as a slide type mobile phone, the sensing unit 140 may sense whether the slide phone is opened or closed. In addition, the sensing unit 140 can detect whether or not the power supply unit 190 supplies power or whether or not the interface unit 170 is coupled with an external device. In FIG. 2, the sensing unit 140 also includes a posture sensor 141 and a proximity sensor 142.

In addition, the output unit 150 is configured to provide outputs in a visual, audible, and/or tactile manner. In the example in FIG. 2, the output unit 150 includes the display unit 151, a sound output module (an audio output module) 152, an alarm unit 153, a haptic module 154, and the like. In more detail, the display unit 151 can display information processed in the mobile terminal 100. For example, when the mobile terminal 100 is in a phone call mode, the display unit 151 can display a User Interface (UI) or a Graphic User Interface (GUI) associated with a call or other communication.

The display unit 151 may also include at least one of a Liquid Crystal Display (LCD), a Thin Film Transistor-LCD (TFT-LCD), an Organic Light Emitting Diode (OLED) display, a flexible display, a three-dimensional (3D) display, or the like. Some of these displays may also be configured to be transparent or light-transmissive to allow for viewing of the exterior, which is called transparent displays.

An example transparent display is a TOLED (Transparent Organic Light Emitting Diode) display, or the like. A rear structure of the display unit 151 may be also light-transmissive. Through such configuration, the user can view an object positioned at the rear side of the terminal body through the region occupied by the display unit 151 of the terminal body.

Further, the mobile terminal 100 may include two or more display units according to its particular desired embodiment. For example, a plurality of display units may be separately or integrally disposed on one surface of the mobile terminal, or may be separately disposed on mutually different surfaces.

Meanwhile, when the display unit 151 and a sensor (referred to as a 'touch sensor', hereinafter) for detecting a touch operation are overlaid in a layered manner to form a touch screen, the display unit 151 can function as both an input device and an output device. The touch sensor may have a form of a touch film, a touch sheet, a touch pad, and the like.

Further, the touch sensor may be configured to convert pressure applied to a particular portion of the display unit 151 or a change in the capacitance or the like generated at a particular portion of the display unit 151 into an electrical input signal. The touch sensor may also be configured to detect the pressure when a touch is applied, as well as the touched position and area.

When there is a touch input with respect to the touch sensor, corresponding signals are transmitted to a touch controller, and the touch controller processes the signals and transmits corresponding data to the controller 180. Accordingly, the controller 180 can recognize which portion of the display unit 151 has been touched.

With reference to FIG. 2, the proximity sensor 142 may be disposed within or near the touch screen. In more detail, the proximity sensor 142 is a sensor for detecting the presence or absence of an object relative to a certain detection surface or an object that exists nearby by using the force of electromagnetism or infrared rays without a physical contact. Thus, the proximity sensor 142 has a considerably longer life span compared with a contact type sensor, and can be utilized for various purposes.

Examples of the proximity sensor 142 include a transmission type photoelectric sensor, a direct reflection type photoelectric sensor, a mirror-reflection type photo sensor, an RF oscillation type proximity sensor, a capacitance type proximity sensor, a magnetic proximity sensor, an infrared proximity sensor, and the like. When the touch screen is the capacitance type, proximity of the pointer is detected by a change in electric field according to the proximity of the pointer. In this instance, the touch screen (touch sensor) may be classified as a proximity sensor.

In the following description, for the sake of brevity, recognition of the pointer positioned to be close to the touch screen will be called a 'proximity touch', while recognition of actual contacting of the pointer on the touch screen will be called a 'contact touch'. Further, when the pointer is in the state of the proximity touch, it means that the pointer is positioned to correspond vertically to the touch screen.

By employing the proximity sensor 142, a proximity touch and a proximity touch pattern (e.g., a proximity touch distance, a proximity touch speed, a proximity touch time, a proximity touch position, a proximity touch movement state, or the like) can be detected, and information corresponding to the detected proximity touch operation and the proximity touch pattern can be output to the touch screen.

Further, the audio output module 152 can convert and output as sound audio data received from the wireless communication unit 110 or stored in the memory 160 in a call signal reception mode, a call mode, a record mode, a voice recognition mode, a broadcast reception mode, and the like. Also, the audio output module 152 can provide audible outputs related to a particular function performed by the mobile terminal 100 (e.g., a call signal reception sound, a message reception sound, etc.). The audio output module 152 may also include a speaker, a buzzer, or the like. In addition, the audio output module 152 may output a sound through an earphone jack.

In addition, the alarm unit 153 can output information about the occurrence of an event of the mobile terminal 100. Typical events include call reception, message reception, key signal inputs, a touch input etc. In addition to audio or video outputs, the alarm unit 153 can provide outputs in a different manner to inform about the occurrence of an event. For example, the alarm unit 153 can provide an output in the form of vibrations. The video signal or the audio signal may be also output through the display unit 151 or the audio output module 152.

In addition, the haptic module 154 generates various tactile effects the user may feel. One example of the tactile effects generated by the haptic module 154 is vibration. The strength and pattern of the haptic module 154 can also be controlled. For example, different vibrations may be combined to be output or sequentially output.

Besides vibration, the haptic module 154 can generate various other tactile effects such as an effect by stimulation such as a pin arrangement vertically moving with respect to a contact skin, a spray force or suction force of air through a jet orifice or a suction opening, a contact on the skin, a contact of an electrode, electrostatic force, etc., an effect by reproducing the sense of cold and warmth using an element that can absorb or generate heat.

The haptic module 154 may also be implemented to allow the user to feel a tactile effect through a muscle sensation such as fingers or arm of the user, as well as transferring the tactile effect through a direct contact. Two or more haptic modules 154 may be provided according to the configuration of the mobile terminal 100.

Further, the memory 160 can store software programs used for the processing and controlling operations performed by the controller 180, or temporarily store data (e.g., a phonebook, messages, still images, video, etc.) that are input or output. In addition, the memory 160 may store data regarding various patterns of vibrations and audio signals output when a touch is input to the touch screen.

The memory 160 may also include at least one type of storage medium including a flash memory, a hard disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 160 over the Internet.

Also, the interface unit 170 serves as an interface with external devices connected with the mobile terminal 100. For example, the external devices can transmit data to an external device, receive and transmit power to each element of the mobile terminal 100, or transmit internal data of the mobile terminal 100 to an external device. For example, the interface unit 170 may include wired or wireless headset ports, external power supply ports, wired or wireless data ports, memory card ports, ports for connecting a device having an identification module, audio input/output (I/O) ports, video I/O ports, earphone ports, or the like.

The identification module may also be a chip that stores various types of information for authenticating the authority of using the mobile terminal 100 and may include a user identity module (UIM), a subscriber identity module (SIM) a universal subscriber identity module (USIM), and the like. In addition, the device having the identification module (referred to as 'identifying device', hereinafter) may take the form of a smart card. Accordingly, the identifying device can be connected with the mobile terminal 100 via a port.

When the mobile terminal 100 is connected with an external cradle, the interface unit 170 can also serve as a passage to allow power from the cradle to be supplied therethrough to the mobile terminal 100 or serve as a passage to allow various command signals input by the user from the cradle to be transferred to the mobile terminal therethrough. Various command signals or power input from the cradle may operate as signals for recognizing that the mobile terminal is properly mounted on the cradle.

In addition, the controller 180 controls the general operations of the mobile terminal. For example, the controller 180 performs controlling and processing associated with voice calls, data communications, video calls, and the like. In the example in FIG. 2, the controller 180 also includes a multimedia module 181 for reproducing multimedia data. The multimedia module 181 may be configured within the controller 180 or may be configured to be separated from the controller 180. The controller 180 can also perform a pattern recognition processing to recognize a handwriting input or a picture drawing input performed on the touch screen as characters or images, respectively.

Also, the power supply unit 190 receives external power or internal power and supplies appropriate power required for operating respective elements and components under the control of the controller 180. Further, various embodiments described herein may be implemented in a computer-readable or its similar medium using, for example, software, hardware, or any combination thereof.

For a hardware implementation, the embodiments described herein may be implemented by using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic units designed to perform the functions described herein. In some cases, such embodiments may be implemented by the controller 180 itself.

For a software implementation, the embodiments such as procedures or functions described herein may be implemented by separate software modules. Each software module may perform one or more functions or operations described herein. Software codes can be implemented by a software application written in any suitable programming language. The software codes may be stored in the memory 160 and executed by the controller 180.

Embodiments of the present invention will be described with reference to the accompanying drawings.

For purposes of illustration, the display unit 151 is a touch screen 151. As described above, the touch screen may perform both display and input of information. However, the embodiments of the present invention are not limited thereto. As used herein, the term "touch" includes a contact touch and a proximate touch.

Figure 3:
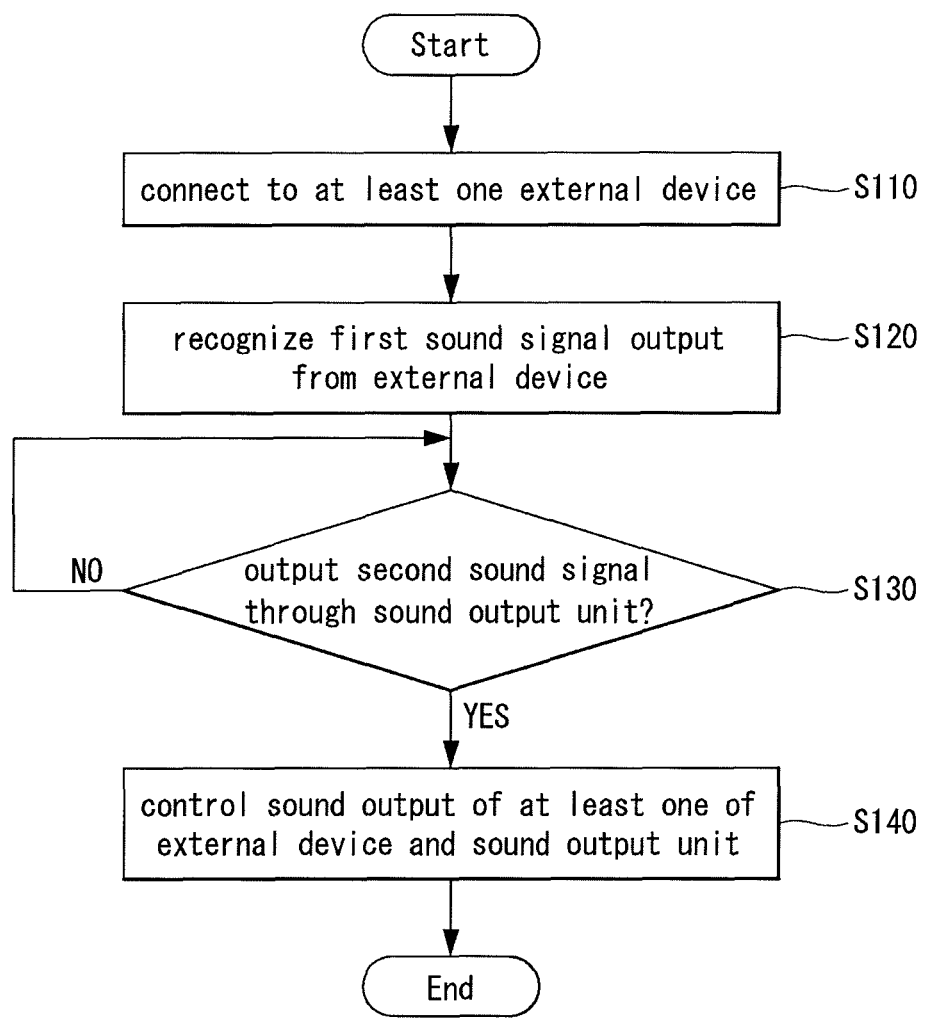
FIG. 3 is a flowchart illustrating a method of controlling an electronic device according to an embodiment of the present invention.
Figure 4:
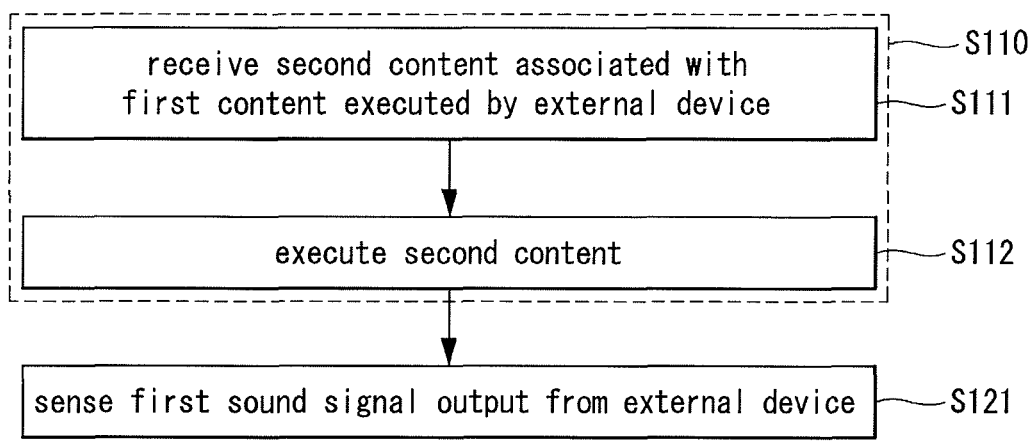
FIG. 4 is a view illustrating in greater detail operation S110 of FIG. 3.
Figure 5:
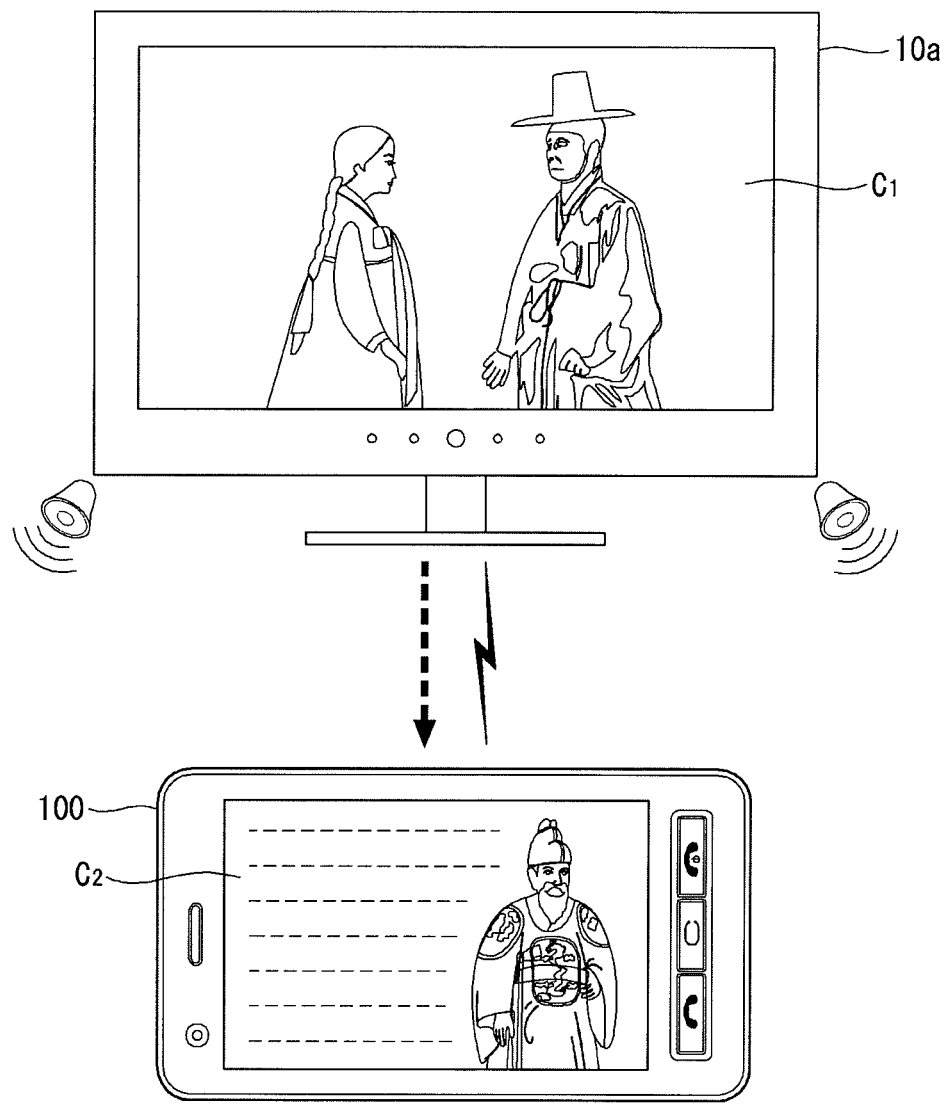
FIGS. 5 to 6 are views illustrating in more detail the embodiment illustrated in FIG. 3.
Figure 6:
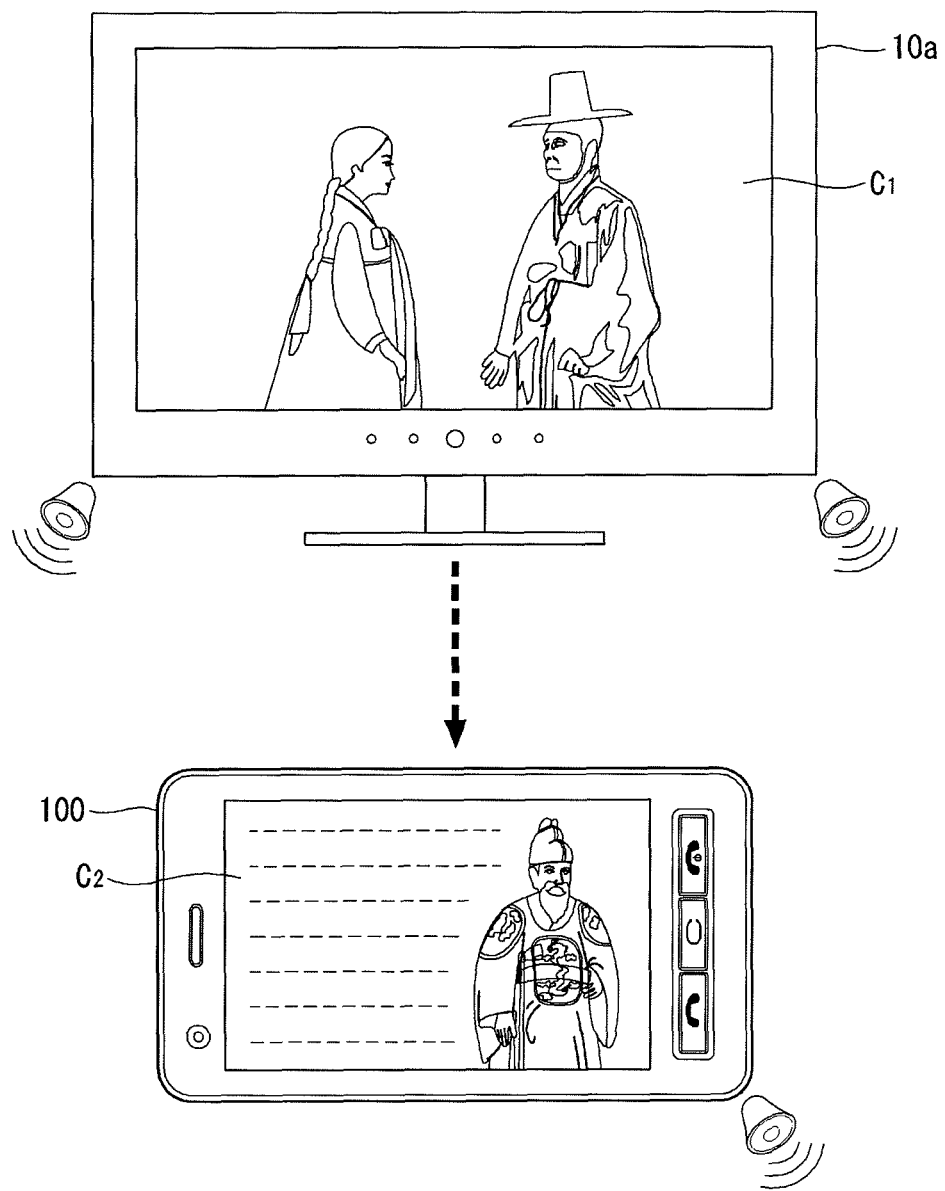

FIG. 3 is a flowchart illustrating a method of controlling an electronic device according to an embodiment of the present invention. FIG. 4 is a view illustrating in greater detail operation S110 of FIG. 3. FIGS. 5 to 6 are views illustrating in more detail the embodiment illustrated in FIG. 3.

The control method illustrated in FIG. 3 may be implemented by the electronic device 100 described in connection with FIG. 2. Hereinafter, the control method and the operation of the electronic device 100 are described with reference to the drawings.

Referring to FIG. 3, the controller 180 establishes a network with at least one external device through a wireless communication unit 110 (also simply referred to as "communication unit") (S110).

The controller 180 may connect the external devices 10*a* and 10*b* to each other in synchronization with the devices 10*a* and 10*b*. When the devices 10*a* and 10*b* are synchronized with each other, the electronic device 100 may simultaneously execute contents that are being run by the devices 10*a* and 10*b*.

For example, a first content displayed by an external device 10*a*, e.g., a TV, may be displayed through the display unit 151 of the electronic device 100. As another example, first content data executed by the external device 10*a* may be transmitted to the electronic device 100 which may in turn run the first content data.

Accordingly, for a predetermined content or another content associated with the predetermined content to be shared between N Screen devices, the N Screen devices need to be connected to one another over a predetermined network.

The controller 180 may recognize a first sound signal output from the external device 10a or 10b.

The first sound signal may include a sound signal associated with the first content executed by the external device 10a or 10b. For example, when an OST of a broadcast program (first content) is output through a speaker while the broadcast program is on the TV 10a, the first sound signal may be the OST of the broadcast program.

The controller 180 may recognize the first sound signal output from the external device 10a or 10b through the microphone 122 (e.g., as shown in FIG. 1).

When receiving audio data associated with the first sound signal to be transferred to the external devices 10a and 10b through the communication unit 110, the controller 180 may recognize the first sound signal. For example, in the case that a predetermined broadcast program (first content) to be executed by the TV 10a is transmitted to the electronic device 100, when determining that the first content includes only audio data, the controller 180 may recognize the first sound signal associated with the first content.

When recognizing the first sound signal output from the external device 10a or 10b, the controller 180 monitors whether a second sound signal is output through the sound output module 152 (also referred to as "sound output unit") (S130).

The second sound signal may be output from the electronic device 100 and may be associated with the first sound signal.

The second sound signal may be the same as the first sound signal. For example, when the first content executed by the TV 10a is simultaneously run by the electronic device 100, the first sound signal may be identical to the second sound signal.

The second sound signal may be associated with the first sound signal. For example, the electronic device 100 may execute the second content (e.g., metadata of the first content) associated with the first content executed by the TV 10a while outputting a sound signal (second sound signal) corresponding to the second content. OST (Original Sound Track) information (second content) associated with a predetermined broadcast program (first content), which is shown on the TV 10a, may be displayed through the display unit 151 of the electronic device 100, and the OST may be executed and output through the audio output module 152 of the electronic device 100.

Then, the controller 180 may control output of at least one of the sound output units 152 of the external devices 10a and 10b and the electronic device 100 (S140).

When the electronic device 100 connected to the external device 10a through a predetermined network outputs a predetermined sound signal while the external device 10a outputs the first sound signal through the sound output unit of the external device 10a, the controller 180 may recognize that the external devices 10a and 10b and the electronic device 100 both output the predetermined sound signal.

For example, when the external devices 10a and 10b and the electronic device 100 all output the predetermined sound signal, the controller 180 may perform control so that the sound signal is output through only one of the external devices 10a and 10b or the electronic device 100. A particular example of such control is described below with reference to FIG. 8 and its subsequent drawings.

When the external devices 10a and 10b are connected to the electronic device 100 through a predetermined network, the electronic device 100 may share predetermined contents with the external devices 10a and 10b.

Referring to FIG. 4, the controller 180 may receive a second content associated with the first content that is executed by the external device 10a or 10b (S111).

The second content may be the same as the first content as described above. The second content may include metadata of the first content.

The controller 180 may execute the second content received from the external device 10a or 10b (S112). For example, when the second content is metadata of the first content and the metadata includes predetermined audio data, the controller 180 may output the audio data included in the metadata through the audio output module 152.

While the electronic device 100 outputs a sound signal according to execution of the second content, the controller 180 may sense the first sound signal output from the external device 10a or 10b (S121).

For example, when one of the external devices outputs the sound signal while the other of the external devices outputs the sound signal, the control method of an electronic device according to an embodiment of the present invention may apply. The order of outputting the sound signal doesn't matter. For example, when the external device 10a or 10b outputs the sound signal while the electronic device 100 outputs the sound signal or when the electronic device 100 outputs the sound signal while the external device 10a or 10b outputs the sound signal, the control method of an electronic device according to an embodiment may apply.

Referring to FIG. 5, the controller 180 may receive a second content C2 associated with a first content C1, which is executed by the external device 10a connected to the electronic device 100 through a network, from the external device 10a and may provide the received second content to the display unit 151 of the electronic device 100.

For example, the controller 180 may receive metadata C2 of a broadcast program from a TV 10a connected through a short-range communication means while executing the first content C1 (e.g., the broadcast program), which is being executed by the TV 10a and may display the metadata C2 through the display unit 151.

The metadata corresponding to auxiliary data of the first content C1 may be received from the external device 10a which executes the first content C1 or from another external device (e.g., a broadcast station) which does not relate to the execution of the first content C1.

The external device 10a may output a first sound signal according to the execution of the first content C1 through a sound output unit of the external device 10a, and the controller 180 may sense the output of the first sound signal.

The controller 180 may sense the output of the first sound signal through the microphone 122 or through an identifier notifying that the first content C1 includes predetermined audio data when receiving the metadata C2 of the first content C1 through the wireless communication unit 110. Accordingly, even when the external device 10a does not substantially output the first sound signal through a speaker during a predetermined time, the electronic device 100 may recognize that the external device 10a outputs the first sound signal.

Referring to FIG. 6, while receiving the metadata C2 associated with the first content C1 including the audio data and providing the received metadata C2 through the display unit 151, the electronic device 100 may output a second sound signal associated with the metadata C2 through the audio output module 152.

For example, when the first sound signal is output through the external device 10a, and the second sound signal is output through the electronic device 100, the controller 180 of the electronic device 100 needs to perform control so that one of the first and second sound signals is output through one electronic device.

In particular, when two sound signals are output through different devices, respectively, as described above, it may be necessary to output only the sound signal to which a user desires to listen.

Figure 7:
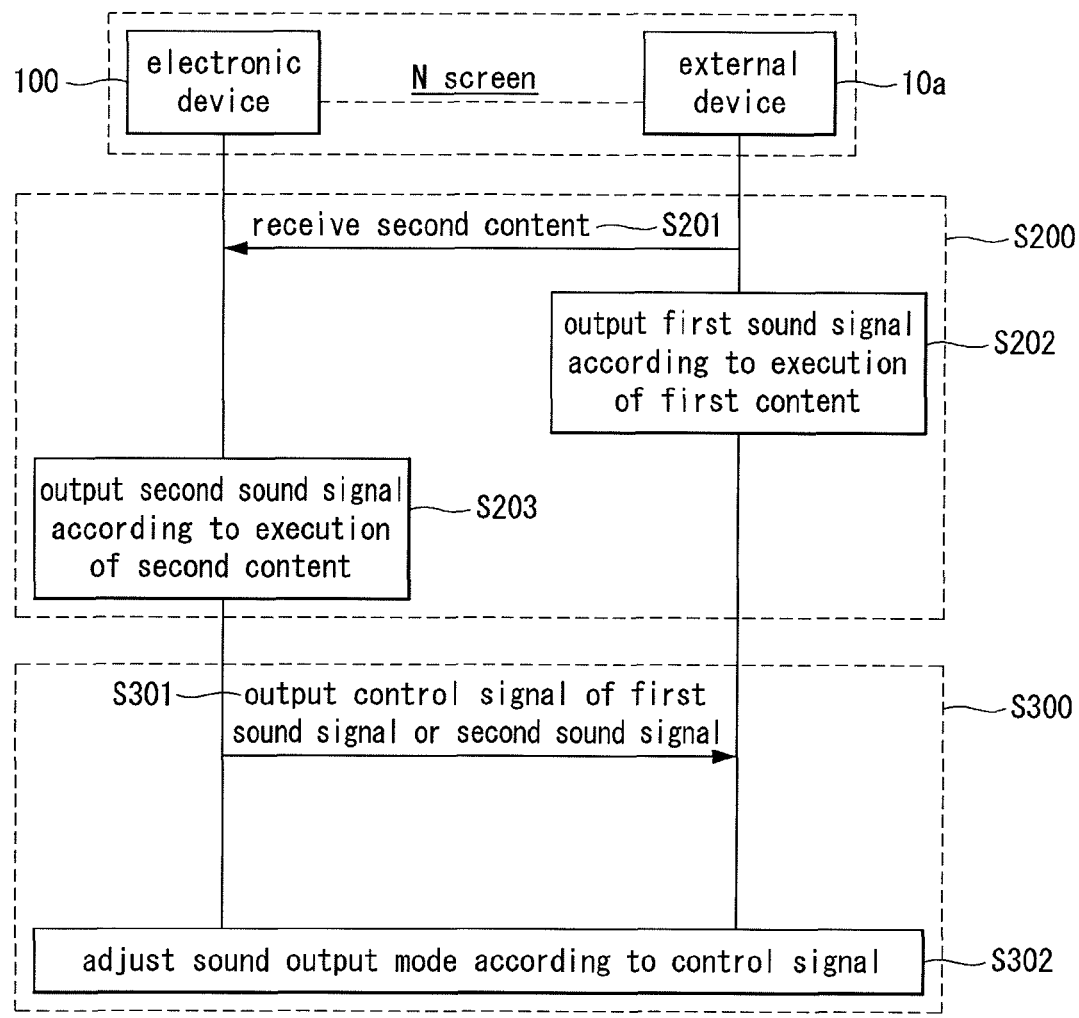
FIG. 7 illustrates the flow of control signals for controlling sound output between a plurality of N-Screen devices according to an embodiment of the present invention.

Referring to FIG. 7, the flow of control signals for the electronic device 100 to control the first or second sound signal by one of the external device 10a or 10b and the electronic device 100 is now described.

FIG. 7 illustrates the flow of control signals for controlling sound output between a plurality of N-Screen devices according to an embodiment of the present invention.

Referring to FIG. 7, the electronic device 100 and the external device 10a each is an N Screen device. The electronic device 100 and the external device 10a may perform data communication to each other through a predetermined network and may share contents executed by each.

The electronic device 100 may sense a first sound signal output from the electronic device 100 and a second sound signal output through the audio output module 152 of the electronic device 100 (S200).

For example, the electronic device 100 may receive the second content from the external device 10a (S201). The second content may include auxiliary data (e.g., metadata) of the first content which is executed by the external device 10a as described above.

Then, the external device 10a may output a first sound signal according to the execution of the first content (S202), and the electronic device 100 may output a second sound signal according to the execution of the second content (S203).

The controller 180 of the electronic device 100 may control sound output of each N Screen device (S300).

For example, the controller 180 of the electronic device 100 may transmit a control signal for controlling output of the first or second sound signal to the external device 10a (S301).

Accordingly, the electronic device 100 and the external device 10a may adjust a sound output mode according to the control signal (S302).

For example, the control signal may enable the first sound signal to be output through the electronic device 100 and may enable the sound output mode of the external device 10a outputting the second sound signal to be set as a 'mute' mode.

As another example, the control signal may enable the first sound signal to be output through the external device 10a and may enable the sound output mode of the electronic device 100 to be set as a mute mode.

As still another example, the control signal may enable the first content executed by the external device 10a to be temporarily stopped while the first sound signal is being output through the electronic device 100.

However, the control signal is not limited thereto and various other control signals may be adopted. For example, the electronic device 100 may convert audio data corresponding to the second sound signal output through the audio output module 152 of the electronic device 100 into text and may display the text through the display unit 151 of the electronic device 100. As another example, the electronic device 100 may provide the touch screen 151 with a user interface for adjusting the volume of a sound output from a plurality of devices connected through a predetermined network, so that the sound output from the plurality of devices may be adjusted through a user's predetermined touch input on the user interface.

Hereinafter, various control methods of an electronic device according to an embodiment are described.

Figure 8:
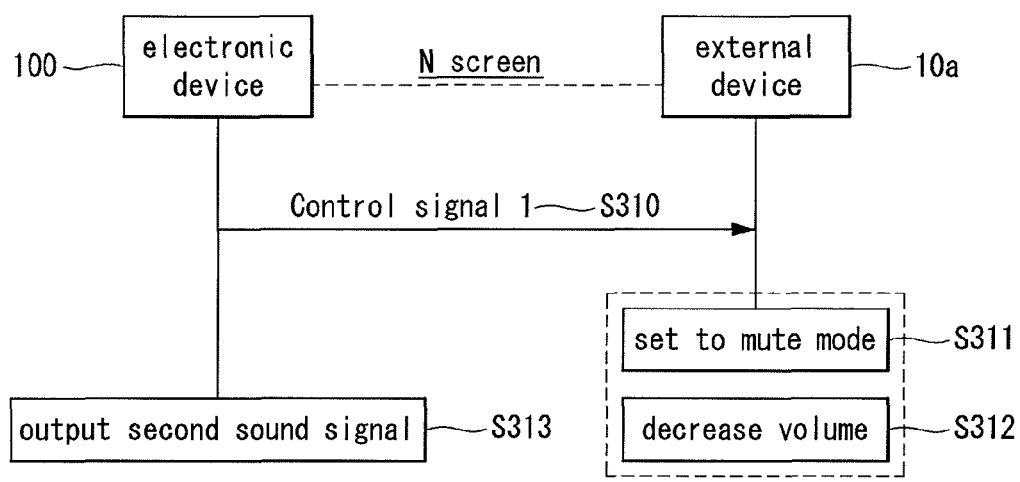
FIG. 8 is a flowchart illustrating a method of controlling an electronic device according to an embodiment of the present invention.
Figure 9:
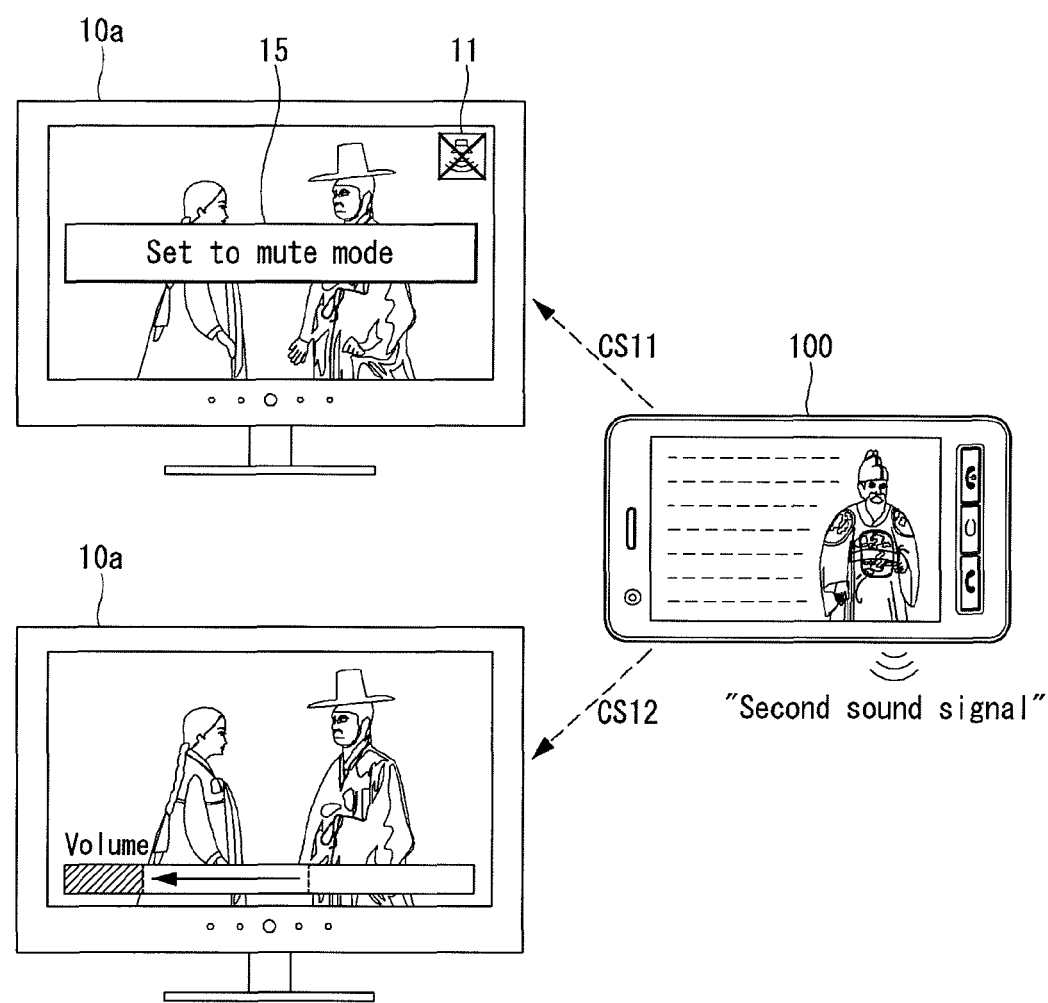
FIG. 9 illustrates a method of controlling an electronic device according to an embodiment of the present invention.

FIG. 8 is a flowchart illustrating a method of controlling an electronic device according to an embodiment of the present invention. FIG. 9 illustrates a method of controlling an electronic device according to an embodiment of the present invention.

The control method may be performed by the electronic device 100 described in connection with FIG. 2. Hereinafter, the control method and the operation of the electronic device 100 are described with reference to the drawings.

For purposes of illustration, the external device 10a and the electronic device 100 simultaneously output first and second sound signals, respectively. According to an embodiment, while the first sound signal is being output through the external device 10a, the second sound signal may be output through the electronic device 100.

Referring to FIG. 8, the controller 180 may transmit a "control signal 1" to the external device 10a (S310). The "control signal 1" may include a signal for setting the sound output mode of the external device 10a into a mute mode or a signal for reducing the volume of the external device 10a to a predetermined level.

Accordingly, when the electronic device 100 outputs the second sound signal through the audio output module 152 (S313), the external device 10a may set the sound output mode into the mute mode (S311) or may decrease the volume (S312).

According to an embodiment, setting the sound output mode of the external device 10a into the mute mode may include performing control through the external device 10a so that the first sound signal associated with the first content is not output through a speaker of the external device 10a.

Accordingly, the control signal 1 may be a signal that enables the first content to be executed through the external device 10a without outputting the first sound signal associated with the execution of the first content.

According to an embodiment, the control signal 1 may pause the first content output by the external device 10a. When the output of the second sound signal through the sound output unit of the electronic device 100 is terminated, the control signal 1 may enable the first content to be executed again through the external device 10a.

For example, referring to FIG. 9, when intending to output the second output signal through the audio output module 152, the electronic device 100 may transmit the control signal 1 (SC11) to the external device 10a. The control signal 1 (SC11) may be a signal for setting the sound output mode of the external device 10a into the mute mode. Accordingly, the external device 10a may set the sound output mode into the mute mode and may provide identifiers 11 and 15 on the screen.

Referring to FIG. 9, the control signal 1 (SC12) may be a signal for reducing the volume of the external device 10a. Accordingly, the external device 10a may reduce the volume of the first sound signal output through the external device 10a into a predetermined level in response to the control signal 1 (SC12). The decreased level of the volume may be preset by a user.

Accordingly, when a plurality of devices simultaneously output sound signals in an N Screen environment, a user may selectively listen to his desired sound signal alone during a predetermined time.

The above-described embodiment may be useful for a user listening to the second sound signal associated with the second content executed by the electronic device 100. However, the embodiments of the present invention are not limited to outputting the second sound signal through the electronic device 100.

Figure 10:
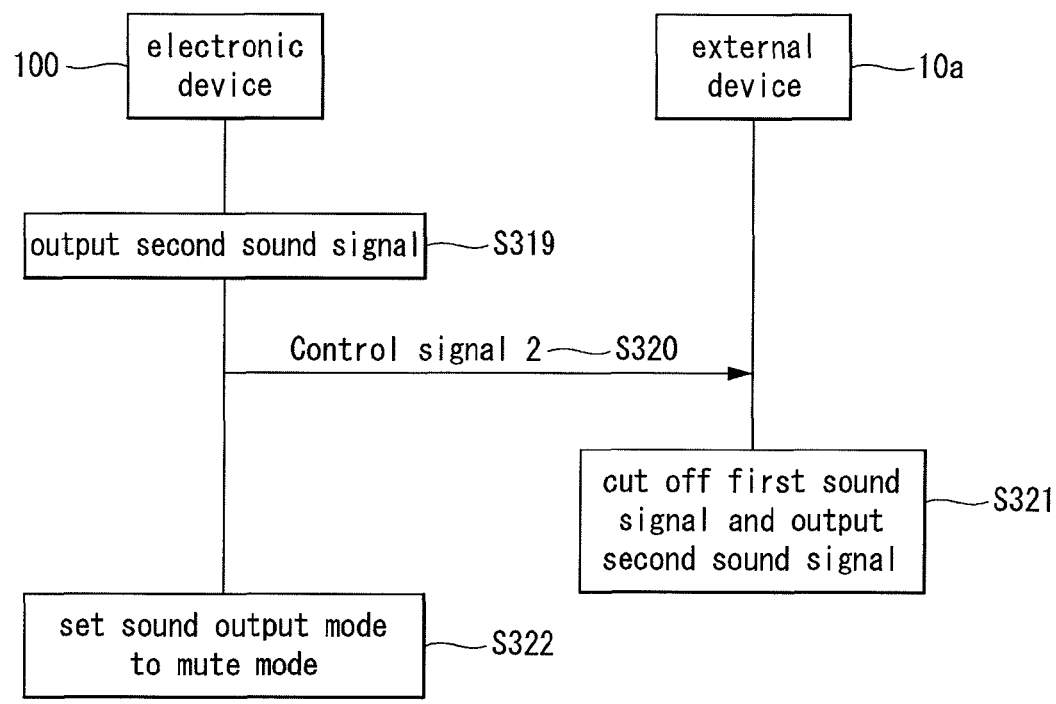
FIG. 10 is a flowchart illustrating a method of controlling an electronic device according to an embodiment of the present invention.
Figure 11:
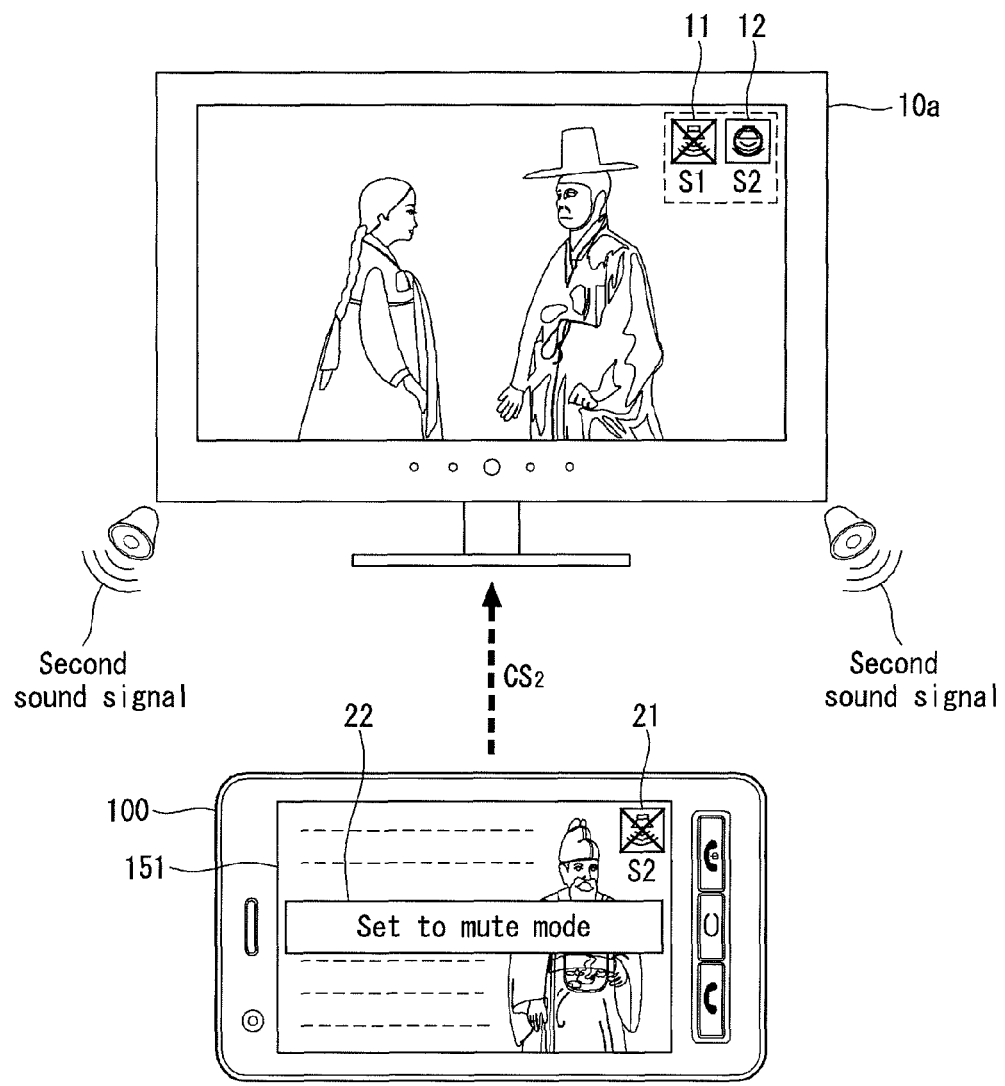
FIG. 11 illustrates a method of controlling an electronic device according to an embodiment of the present invention.

FIG. 10 is a flowchart illustrating a method of controlling an electronic device according to an embodiment of the present invention. FIG. 11 illustrates a method of controlling an electronic device according to an embodiment of the present invention.

The control method may be performed by the electronic device 100 described in connection with FIGS. 1 and 2. The control method and operation of the electronic device are described with reference to the drawings. The following embodiment may be implemented based on the above-described embodiment.

Referring to FIG. 10, the controller 180 may transmit a "control signal 2" to the external device 10a (S320). Before the transmission, the electronic device 100 may output the second sound signal (S319).

The control signal 2 may perform control so that the second sound signal is output through the external device 10a. Accordingly, the external device 10a may block the output of the first sound signal and may output the second sound signal (S321). The electronic device 100 may set the sound output mode into a mute mode (S322).

For example, referring to FIG. 11, when intending to output the second sound signal while the external device 10a outputs the first sound signal, the controller 180 may transmit the control signal 2 (SC2) to the external device 10a.

The external device 10a may receive the control signal 2 (SC2) while outputting the second sound signal. The control signal 2 (SC2) may enable the external device 10a to stop outputting the first sound signal but instead to output the second sound signal. Accordingly, the external device 10a outputs the second sound signal through a speaker.

The controller 180 of the electronic device 100 may set the sound output mode into the mute mode and may display identifiers 21 and 22 through the display unit 151 to notify the setting into the mute mode.

The external device 10a may display the identifiers 11 and 12 to identify whether the sound signal output through the sound output unit is the first sound signal or second sound signal.

According to an embodiment, while the electronic device 100 displays the metadata of the first content executed by the external device 10a through the display unit 151, the metadata may include audio data. Under this circumstance, a user may desire to visually use the metadata provided through the electronic device 100 while listening to the first sound signal for the first content executed by the external device 10a.

Figure 12:
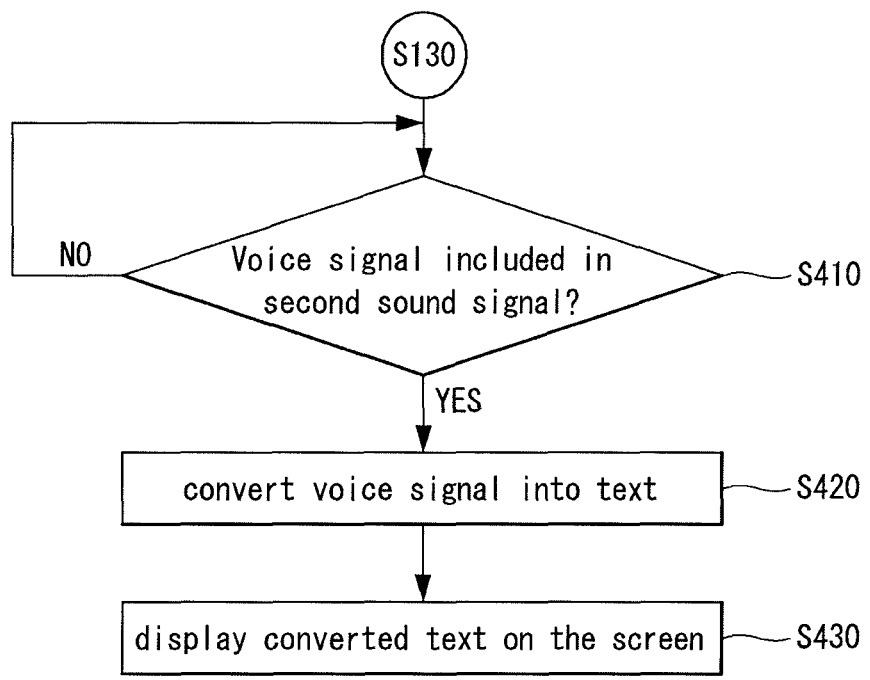
FIG. 12 is a flowchart illustrating a method of controlling an electronic device according to an embodiment of the present invention.
Figure 13:
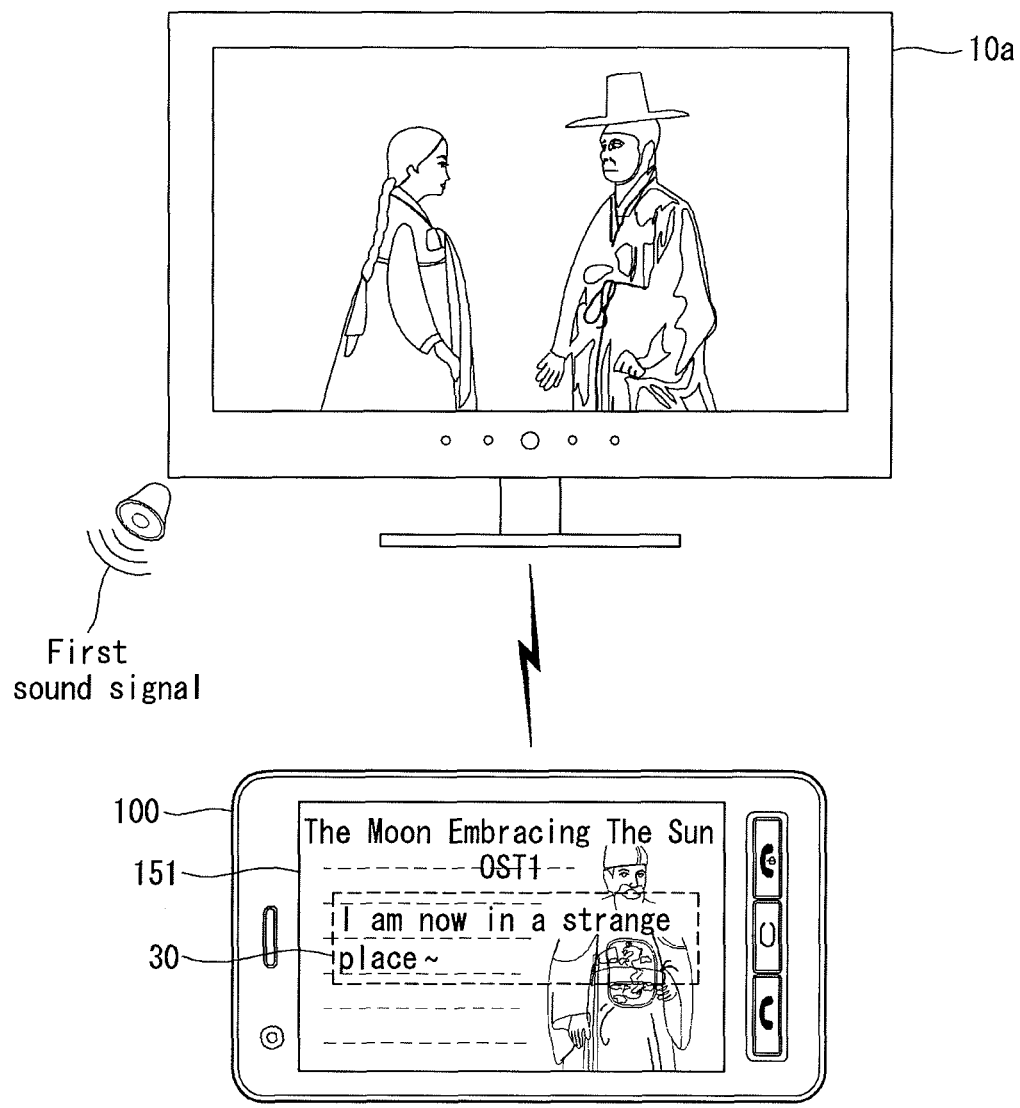
FIG. 13 illustrates a method of controlling an electronic device according to an embodiment of the present invention.

FIG. 12 is a flowchart illustrating a method of controlling an electronic device according to an embodiment of the present invention. FIG. 13 illustrates a method of controlling an electronic device according to an embodiment of the present invention.

The control method may be performed by the electronic device 100 described in connection with FIG. 2. The control method and operation of the electronic device are described with reference to the drawings. The following embodiment may be implemented based on the above-described embodiments.

Referring to FIG. 12, when the electronic device 100 intends to output the second sound signal while outputting the first sound signal through the external device 10a, the controller 180 may determine whether the second sound signal includes a voice signal (S410).

When the second sound signal includes a voice signal, the controller 180 may convert the voice signal into text (S420).

The controller 180 may then display the converted text through the display unit 151. The controller 180 may set the sound output mode into the mute mode so that the second sound signal is blocked from being output through a speaker.

A user may listen to the first sound signal according to the execution of the first content through the external device 10a and may view the visualized second sound signal corresponding to metadata of the first content through the electronic device 100.

For example, referring to FIG. 13, the external device 10a may execute the first content (e.g., a drama titled "The Moon Embracing the Sun"), and the electronic device 100 may receive metadata of the first content from the external device 10a and execute the metadata. When the metadata includes an OST of the drama, which is being output through the external device 10a, the controller 180 of the electronic device 100 may convert the audio data of the sound signal into text data without outputting the OST as a separate sound signal through the electronic device 100 and may display the converted text data 30 through the display unit 151.

Under this situation, the controller 180 may perform control so that only one of the sound signals simultaneously output from the electronic device 100 and the external device 10a is output.

In the above embodiments, when there is a sound signal output from each N Screen device, control is performed so that the sound signal is output from any one device. However, the embodiments of the present invention are not limited thereto. For example, even without blocking a sound signal output from a particular device among the plurality of N Screen devices, a user may listen to a sound signal which he desires in such a manner that the desired sound signal is differentiated from the other sound signals.

Figure 14:
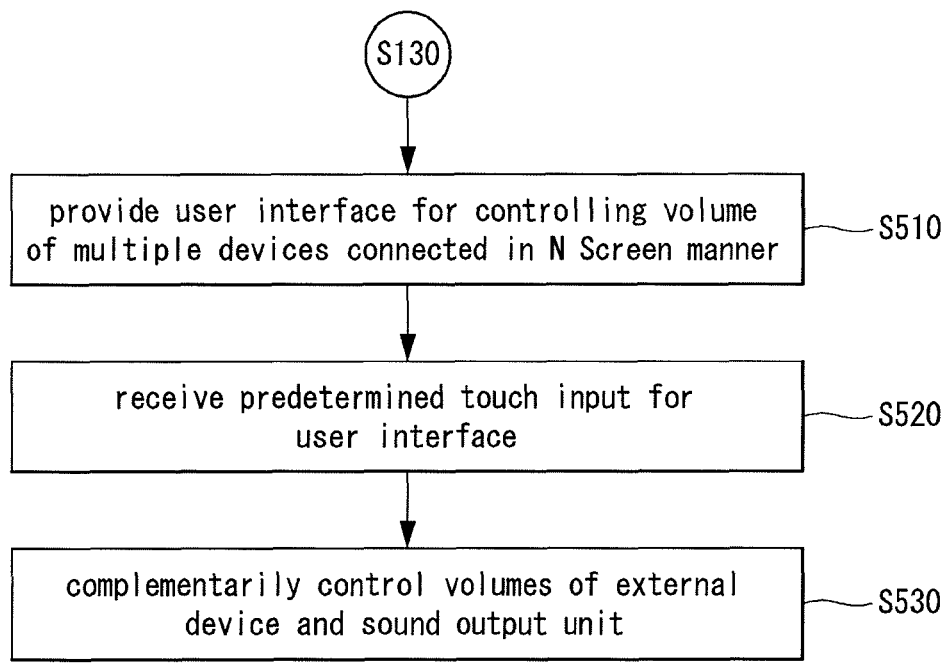
FIG. 14 is a flowchart illustrating a method of controlling an electronic device according to an embodiment of the present invention.
Figure 15:
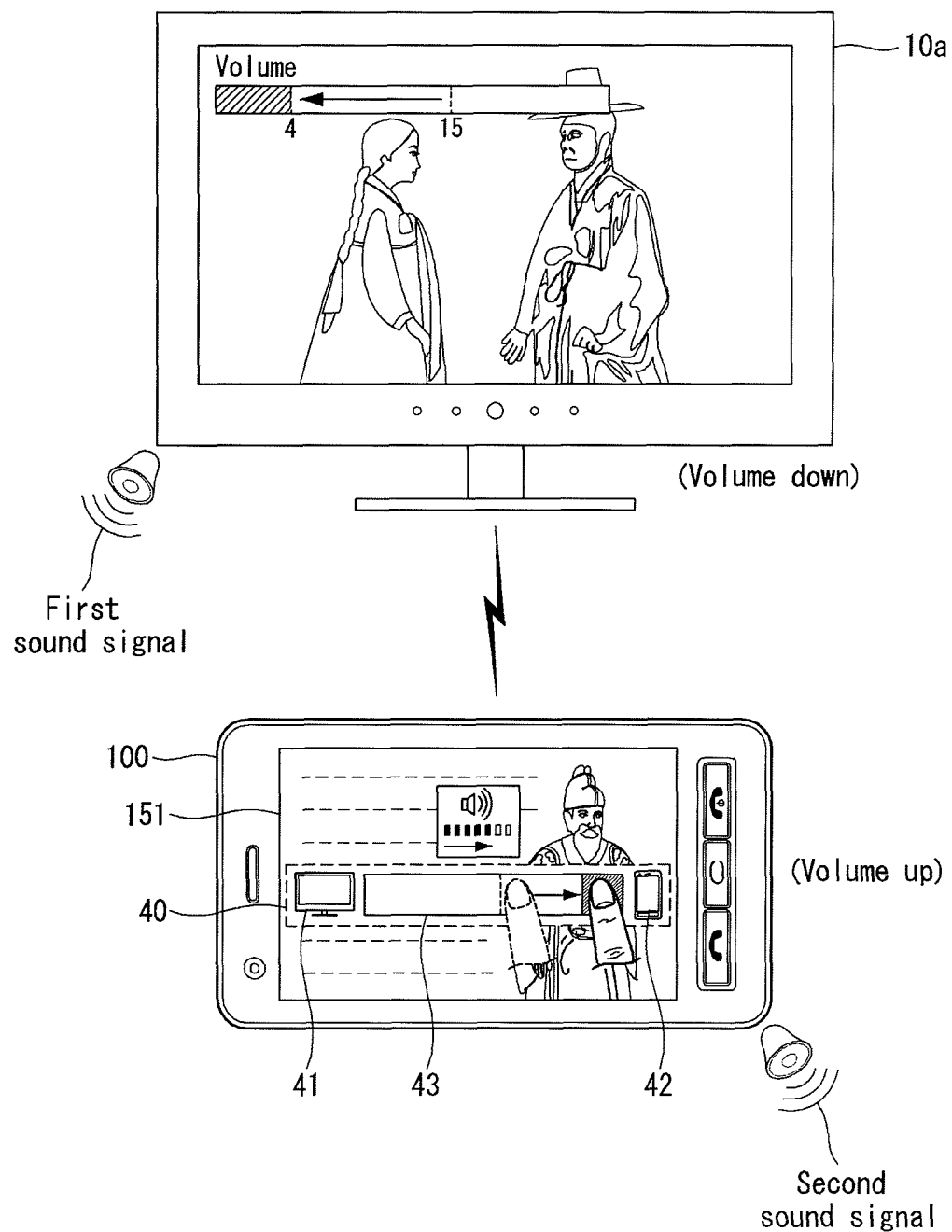
FIG. 15 illustrates a method of controlling an electronic device according to an embodiment of the present invention.

FIG. 14 is a flowchart illustrating a method of controlling an electronic device according to an embodiment of the present invention. FIG. 15 illustrates a method of controlling an electronic device according to an embodiment of the present invention.

The control method may be performed by the electronic device 100 described in connection with FIG. 2. The control method and operation of the electronic device are described with reference to the drawings. The following embodiment may be implemented based on the above-described embodiments.

When the electronic device 100 attempts to output the second sound signal while outputting the first sound signal through the external device 10a (S130), the controller 180 may display a user interface for controlling the volume of a plurality of devices in an N Screen manner through the display unit 151 (S510).

Referring to FIG. 15, the type of the user interface 40 may vary depending on the number of N Screen devices which output sounds. For example, when the N Screen devices outputting sounds include two devices, such as the external device 10a and the electronic device 100, the user interface 40 may be shaped as a bar. Identifiers 41 and 42 may be displayed at two ends of the bar-shaped user interface 43 to identify the respective devices outputting sounds.

The identifiers 41 and 42 may be icons representing the outer appearances of the respective devices.

Turning back to FIG. 14, the controller 180 may receive a predetermined touch input for the user interface 40 (S520).

The controller 180 may complementarily control the volume of the sound output units 152 of the external device 10a and the electronic device 100 in response to the touch input (S530).

As used herein, the term "complementarily" means that when the volume of a first device increases, the volume of a second device decreases, and vice versa.

For example, referring to FIG. 15, when receiving a touch input for moving rightward a particular region of the user interface 43 for controlling the volume, the controller 180 may generate a control signal that enables the volume of the electronic device 100 to increase while complementarily enabling the volume of the external device 10a to decrease. The generated control signal may apply to each of the electronic device 100 and the external device 10a.

Accordingly, the volume of the first sound signal output from the external device 10a decreases and an identifier for indicating that the volume of the first sound signal decreases may be displayed on the screen.

Further, the volume of the second sound signal output from the electronic device 100 increases and an identifier for indicating that the volume of the second sound signal increases may be displayed through the touch screen 151.

However, the control methods according to the embodiments of the present invention are not limited to those described above, and a diversity of variations may be made.

Figure 16:
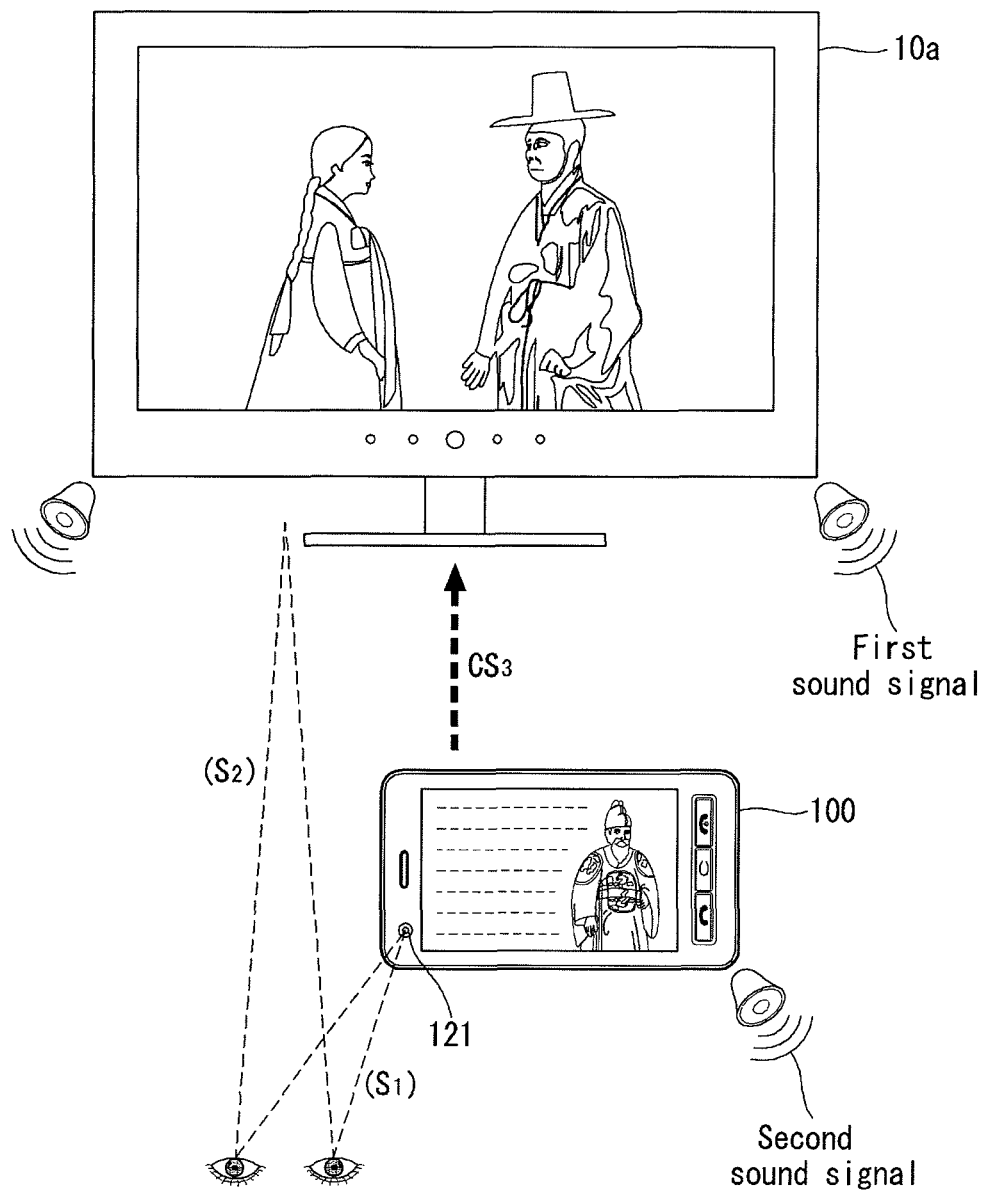
FIG. 16 is a view illustrating a method of controlling an electronic device according to an embodiment of the present invention.

FIG. 16 is a view illustrating a method of controlling an electronic device according to an embodiment of the present invention.

For example, the electronic device 100 may include a camera 121 that takes an image of a user's eye. As a consequence of the image taking, the controller 180 may track the movement of the user's eye, thus determining whether the user takes a look at the electronic device 100 or the external device 10a.

Accordingly, when the electronic device 100 attempts to output the second output signal while outputting the first sound signal through the external device 10a, the controller 180 may determine the direction in which the user's eye is oriented and may transmit a "control signal 3" (SC3) to the external device 10a.

When the user's eye is oriented toward the electronic device 100, the control signal 3 (SC3) may include a signal that enables the controller 180 to set the sound output mode of the external device 10a to the mute mode.

When the user's eye is not oriented toward the electronic device 100, the control signal 3 (SC3) may include a signal that enables the controller 180 to determine that the user views the external device 10a and to set the sound output mode of the electronic device 100 to the mute mode.

Figure 17:
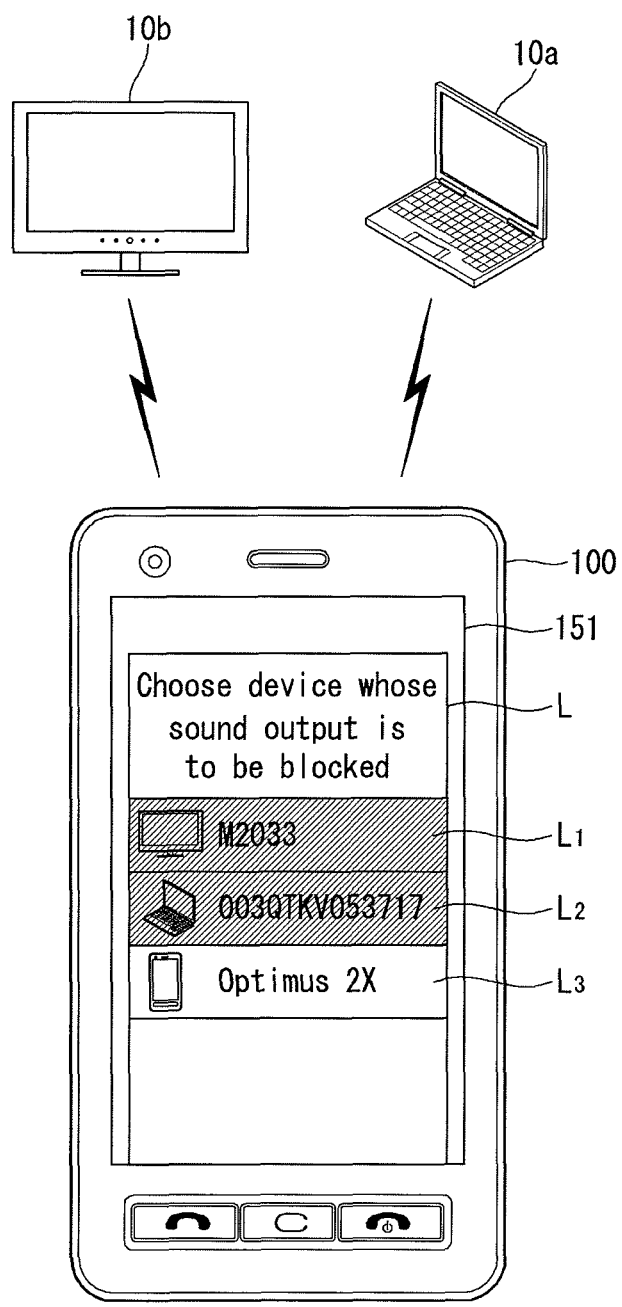
FIG. 17 is a view illustrating a method of controlling an electronic device according to an embodiment of the present invention.

FIG. 17 is a view illustrating a method of controlling an electronic device according to an embodiment of the present invention.

Referring to FIG. 17, when the electronic device 100 attempts to output the second sound signal while at least one external device 10a or 10b outputs the first sound signal, the controller 180 may display a user interface L through the touch screen 151 to select a device to output the sound signal among the N Screen devices.

The user interface may include a list L of devices L1, L2, and L3 outputting sound signals among the N Screen devices.

The controller 180 may transmit a control signal to a device selected from the list L to set the sound output mode of the selected device to the mute mode.

The methods of controlling an electronic device according to the embodiments of the present invention may be recorded in a recording medium as a program that may be readable and executable by a computer.

According to the embodiments of the present invention, an electronic device and a method of controlling the electronic device provide the following effects.

When N-Screen devices, such as a main device and an auxiliary device, included in a predetermined network output respective predetermined sound signals, the sound output may be more efficiently controlled between the N-Screen devices.

Accordingly, even when the plurality of devices connected to each other through the network output respective sound signals, a control may be performed so that a user's desired device may output the sound signal.

Further, when a plurality of devices connected to one another through a predetermined network output respective predetermined sound signals at the same time, the sound output volume of each device may be adjusted so that a user may listen to his desired sound signal.

The control methods may be executed by software. When the control methods are executed by software, the components of the control method may correspond to code segments that may execute necessary operations. The program or code segments may be stored in a readable storage medium.

The computer readable recording medium may include all types of recording devices in which computer readable data is stored, examples of which include ROMs, RAMs, CD-ROMs, DVD±ROMs, DVD-RAMs, magnetic tapes, floppy disks, hard disks, optical data storage devices, etc. The computer readable recording media may be distributed to computers connected to one another over a network so that computer readable codes may be stored in the media in a distributed manner.

The embodiments of the invention have been explained above with reference to exemplary embodiments. It will be evident to those skilled in the art that various modifications may be made thereto without departing from the broader spirit and scope of the invention. Further, although the invention has been described in the context its implementation in particular environments and for particular applications, those skilled in the art will recognize that the present invention's usefulness is not limited thereto and that the invention can be beneficially utilized in any number of environments and implementations. The foregoing description and drawings are, accordingly, to be regarded in an illustrative rather than a restrictive sense.

What is claimed is:

1. An electronic device comprising:
a display unit;
a communication unit configured to connect to an external device;
a sound output unit; and
a controller configured to:
receive a second content associated with a first content, wherein the first content is executed by the external device,
recognize a first sound signal output from the external device, and a second sound signal output from the sound output unit of the electronic device, and
display a user interface for controlling a sound output of the first sound signal from the external device and the second sound signal from the electronic device on the display unit while the first sound signal and the second sound signal are being output.

2. The electronic device of claim 1, wherein the controller is configured to be synchronized with the external device through the communication unit to share a content executed by the external device.

3. The electronic device of claim 1, wherein the controller is configured to receive the second content associated with the first content executed by the external device through the communication unit, and wherein the second sound signal includes a sound signal associated with the second content.

4. The electronic device of claim 3, wherein the second content includes metadata of the first content.

5. The electronic device of claim 1, wherein the controller is configured to transmit a control signal to the external device through the communication unit, and wherein the control signal is configured to set a sound output mode of the external device to a mute mode.

6. The electronic device of claim 1, wherein the controller is configured to transmit a control signal to the external device, wherein the control signal is configured to enable the second sound signal to be output from the external device.

7. The electronic device of claim 6, wherein the controller is configured to set a sound output mode of the sound output unit to a mute mode.

8. The electronic device of claim 1, wherein the second sound signal includes a voice signal, and wherein the controller is configured to convert the voice signal into text and to display the converted text through the display unit.

9. The electronic device of claim 1, wherein the display input comprises a touch screen, and
wherein the controller is configured to provide a user interface to the touch screen to complementarily control volumes of the first and second sound signals output through the external device and the sound output unit.

10. The electronic device of claim 1, wherein the display input comprises a touch screen, and
wherein the controller is configured to display a user interface to select a device to output a sound among the external device and the sound output unit on the touch screen.

11. The electronic device of claim 1, wherein the first sound signal and the second sound signal are the same.

12. The electronic device of claim 1, wherein the controller is configured to display the user interface when the second sound signal is output from the electronic device during the first sound signal being output from the external device.

13. The electronic device of claim 1, wherein the controller is configured to display the user interface when the first sound signal is output from the external device during the second sound signal being output from the electronic device.

14. The electronic device of claim 1, wherein the controller is configured to display the user interface when the first sound signal and the second sound signal are output simultaneously.

15. The electronic device of claim 1, wherein the user interface comprises a bar corresponding to a respective device, wherein the controller is further configured to control a volume of the respective device in response to a touch input on the bar.

16. An electronic device comprising:
a sound output unit;
a communication unit configured to establish a network with an external device; and
a controller configured to:
receive an auxiliary content of a main content executed by the external device through the communication unit; and
output a control signal for controlling one of a first sound signal being output through the external device or a second sound signal being output through the sound output unit in case that the second sound signal is output in response to execution of the auxiliary content through the sound output unit while the first sound signal is output in response to execution of the main content through the external device,
wherein the first sound signal is different from the second sound signal.

17. The electronic device of claim 16, wherein the auxiliary content includes metadata of the main content.

18. An electronic device comprising:
a communication unit;
a touch screen;
a sound output unit; and
a controller configured to:
recognize a first sound signal output by an external device connectable through the communication unit,
display a user interface on the touch screen to complementarily control volumes of the first sound signal output through the sound output unit and a second sound signal output through the external device, respectively, when a second sound signal is output through the sound output unit, and
when a particular direction a drag input is applied to the user interface, output a control signal to increase an output volume of the external device corresponding to the particular direction.

19. The electronic device of claim 18, wherein the controller is configured to output a control signal to decrease an output volume corresponding to an opposite direction to the particular direction.

20. A method of controlling an electronic device, the method comprising:
connecting to an external device through a communication unit of the electronic device;
receiving a second content associated with a first content, wherein the first content is executed by the external device;
recognize a first sound signal output from the external device, and a second sound signal output from a sound output unit of the electronic device; and
displaying a user interface for controlling a sound output of the first sound signal from the external device and the second sound signal from the electronic device on a display unit while the first sound signal and the second sound signal are being output.

21. The method of claim 20, wherein the first sound signal and the second sound signal are the same.

22. The method of claim 20, further comprising:
synchronizing the electronic device with the external device; and
receiving a content associated with a content executed by the external device.

23. A method of controlling an electronic device, the method comprising:
forming a network with at least one external device through a communication unit of the electronic device;
receiving an auxiliary content of a main content executed by the at least one external device through the communication unit;
recognizing a first sound signal output through the at least one external device according to execution of the main content;
recognizing a second sound signal through a sound output unit of the electronic device according to execution of the auxiliary content; and
outputting a control signal for controlling one of the first sound signal being output through one of the at least one the external device or the second sound signal being output the sound output unit in case that the second sound signal is output in response to execution of the auxiliary content through the sound output unit, wherein the first sound signal is different from the second sound signal.

* * * * *